(12) United States Patent
Ryu et al.

(10) Patent No.: US 12,484,379 B2
(45) Date of Patent: Nov. 25, 2025

(54) ELECTROLUMINESCENT DISPLAY APPARATUS

(71) Applicant: LG Display Co., Ltd., Seoul (KR)

(72) Inventors: Won Sang Ryu, Paju-si (KR); Sung Soo Shin, Paju-si (KR); Youn Gyoung Chang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 541 days.

(21) Appl. No.: 17/972,112

(22) Filed: Oct. 24, 2022

(65) Prior Publication Data

US 2023/0209896 A1    Jun. 29, 2023

(30) Foreign Application Priority Data

Dec. 24, 2021   (KR) .................. 10-2021-0187677

(51) Int. Cl.
*H10K 59/121*   (2023.01)
*H10D 86/40*    (2025.01)
(Continued)

(52) U.S. Cl.
CPC ....... *H10K 59/1213* (2023.02); *H10D 86/441* (2025.01); *H10D 86/481* (2025.01);
(Continued)

(58) Field of Classification Search
CPC .... H10D 86/423; H10D 86/60; H10D 86/481; H10D 86/441; H10D 30/6731; H10D 30/6745; H10D 30/6755; H10D 86/471; H10D 86/431; H10D 86/411; H10D 86/421; H10D 86/0221; H10D 30/6723; H10D 86/451; H10K 59/1216; H10K 59/1213; H10K 59/131; H10K 59/124; H10K 59/126; H01L 25/167; H10H 29/142; G09G 3/3233; G09G 3/3225; G09G 3/3266;
(Continued)

(56) References Cited

U.S. PATENT DOCUMENTS

2016/0343737 A1*  11/2016  Zhang .................. H10D 86/425
2016/0372497 A1*  12/2016  Lee ....................... H10D 86/471
(Continued)

*Primary Examiner* — Mouloucoulaye Inoussa
(74) *Attorney, Agent, or Firm* — Morgan, Lewis & Bockius LLP

(57) ABSTRACT

An electroluminescent display apparatus may include a first semiconductor pattern including a first channel region and a first conductive region which is a region other than the first channel region, a first gate electrode overlapping the first channel region of the first semiconductor pattern with a first gate insulation layer therebetween, a first interlayer insulation layer covering the first semiconductor pattern, and the first gate electrode, a second semiconductor pattern disposed on the first interlayer insulation layer, the second semiconductor pattern including a second channel region and a second conductive region which is a region other than the second channel region, and a second gate electrode overlapping the second channel region of the second semiconductor pattern with a second gate insulation layer therebetween. The first conductive region of the first semiconductor pattern partially overlaps the second conductive region of the second semiconductor pattern with the first interlayer insulation layer therebetween.

18 Claims, 12 Drawing Sheets

(51) Int. Cl.
*H10D 86/60* (2025.01)
*H10K 59/131* (2023.01)

(52) U.S. Cl.
CPC ......... *H10D 86/60* (2025.01); *H10K 59/1216* (2023.02); *H10K 59/131* (2023.02)

(58) Field of Classification Search
CPC ............. G09G 3/3275; G09G 2310/08; G09G 2300/0413; G09G 2300/0426; H02J 13/00016; H04L 47/2416; G06F 1/26; H04Q 2209/826
See application file for complete search history.

(56) References Cited

U.S. PATENT DOCUMENTS

| | | | |
|---|---|---|---|
| 2017/0338252 A1* | 11/2017 | Lee ........................ | H10D 86/481 |
| 2018/0033805 A1* | 2/2018 | Gupta ................... | H10D 86/471 |
| 2018/0061922 A1* | 3/2018 | Kim ........................ | H10K 71/00 |
| 2018/0062105 A1* | 3/2018 | Lius ................... | H10K 59/1216 |
| 2018/0151114 A1* | 5/2018 | Choi ..................... | H10D 86/481 |
| 2018/0219032 A1* | 8/2018 | Lou ....................... | H10D 86/425 |
| 2019/0088200 A1* | 3/2019 | Woo ..................... | H10K 59/352 |
| 2019/0115412 A1* | 4/2019 | Cha ..................... | H10K 59/1216 |
| 2020/0006401 A1* | 1/2020 | Hwang ................. | H10D 86/421 |
| 2020/0105799 A1* | 4/2020 | Yuan ..................... | H10D 86/481 |
| 2020/0343471 A1* | 10/2020 | Lius ..................... | H10K 50/805 |
| 2021/0202605 A1* | 7/2021 | Wu ....................... | H10D 86/481 |
| 2021/0273032 A1* | 9/2021 | Kim ..................... | H10D 86/481 |
| 2021/0343756 A1* | 11/2021 | Chung ................. | H10D 86/427 |
| 2021/0391401 A1* | 12/2021 | Kim ..................... | G09G 3/3266 |
| 2021/0408190 A1* | 12/2021 | Yang ..................... | H10K 59/123 |
| 2022/0093679 A1* | 3/2022 | Jo ......................... | H10D 86/441 |
| 2022/0181420 A1* | 6/2022 | Kim ..................... | H10K 59/124 |

* cited by examiner

ELECTROLUMINESCENT DISPLAY APPARATUS

CROSS-REFERENCE TO RELATED APPLICATIONS

This application claims the benefit of and priority to Korean Patent Application No. 10-2021-0187677 filed on Dec. 24, 2021, the entirety of which is incorporated herein by reference for all purposes, as if fully set forth herein.

BACKGROUND

1. Technical Field

The present disclosure relates to an apparatus and particularly to, for example, without limitation, an electroluminescent display apparatus.

2. Discussion of the Related Art

Electroluminescent display apparatuses may include a plurality of pixels, and each of the plurality of pixels may emit light of a specific color. Each pixel may include a light emitting device, a plurality of thin film transistors (TFTs), a capacitor, and a plurality of signal lines.

Because the TFTs are formed on the same plane, contact holes for connecting the TFTs to the signal lines are needed, and moreover, a separate jumping line and contact hole for forming the capacitor are needed. The contact holes may need to be formed wider than an area needed for a process margin.

In electroluminescent display apparatuses of the related art, due to a number of contact holes and jumping lines, it is difficult to increase an aperture ratio and a pixel per inch (PPI) of each pixel.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

To overcome the aforementioned problems and other disadvantages of the related art, the present disclosure may provide an electroluminescent display apparatus in which the number of contact holes is reduced and a jumping line is removed, and thus, an aperture ratio and a pixel per inch (PPI) of each pixel increase.

To achieve these objects and other advantages and aspects of the present disclosure, as embodied and broadly described herein, in one or more aspects, an electroluminescent display apparatus may include a first semiconductor pattern disposed on a substrate, the first semiconductor pattern including a first channel region and a first conductive region which is a region other than the first channel region, a first gate electrode overlapping the first channel region of the first semiconductor pattern with a first gate insulation layer therebetween, a first interlayer insulation layer covering the first semiconductor pattern, and the first gate electrode, a second semiconductor pattern disposed on the first interlayer insulation layer, the second semiconductor pattern including a second channel region and a second conductive region which is a region other than the second channel region, and a second gate electrode overlapping the second channel region of the second semiconductor pattern with a second gate insulation layer therebetween. The first conductive region of the first semiconductor pattern may partially overlap the second conductive region of the second semiconductor pattern with the first interlayer insulation layer therebetween.

Other apparatuses, devices, methods, features and advantages will be, or will become, apparent to one with skill in the art upon examination of the following figures and detailed description. It is intended that all such additional apparatuses, devices, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure. In the drawings.

Figure 1:
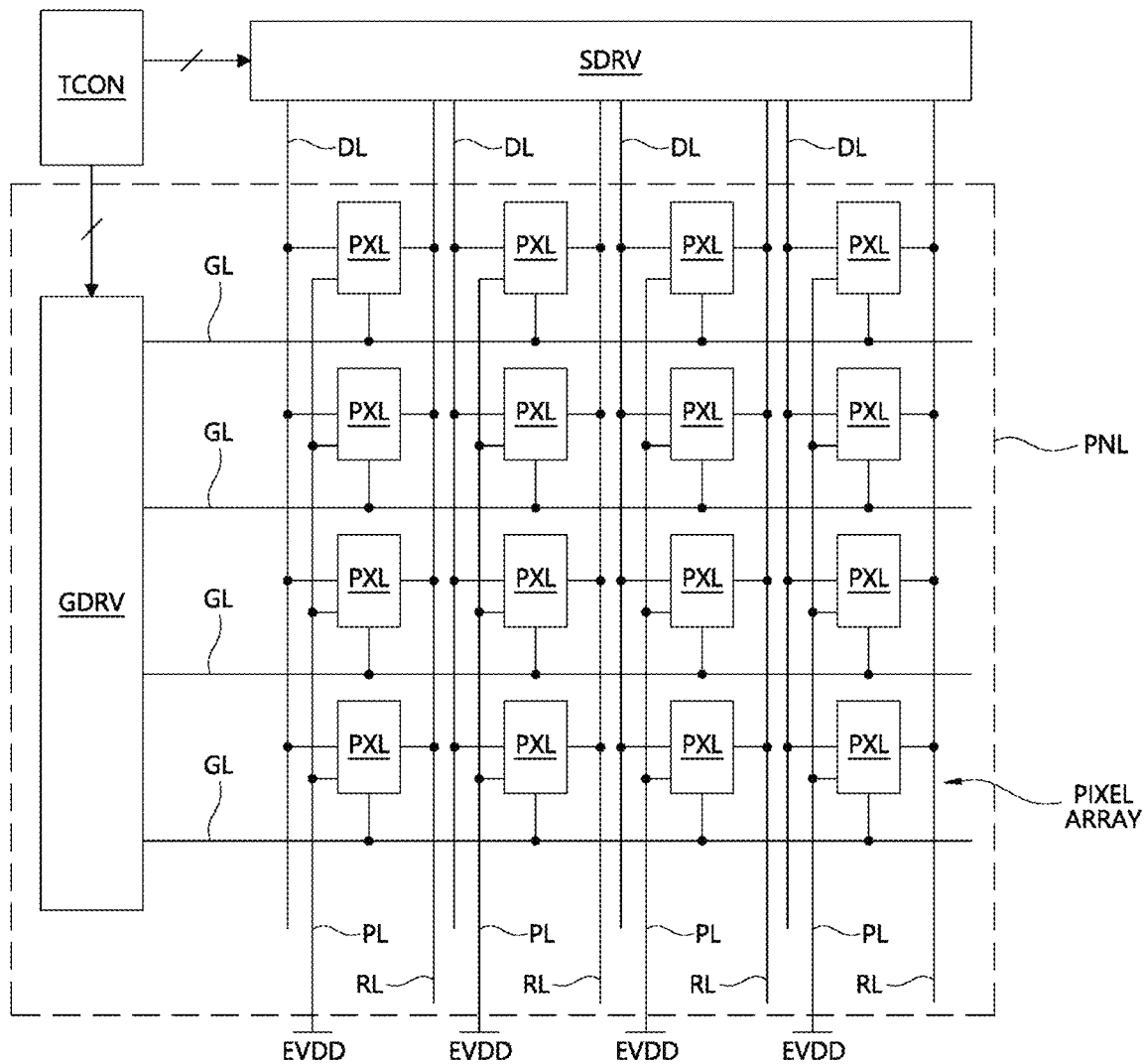
FIG. 1 is a block diagram illustrating an electroluminescent display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience

DETAILED DESCRIPTION OF THE DISCLOSURE

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

Figure 2:
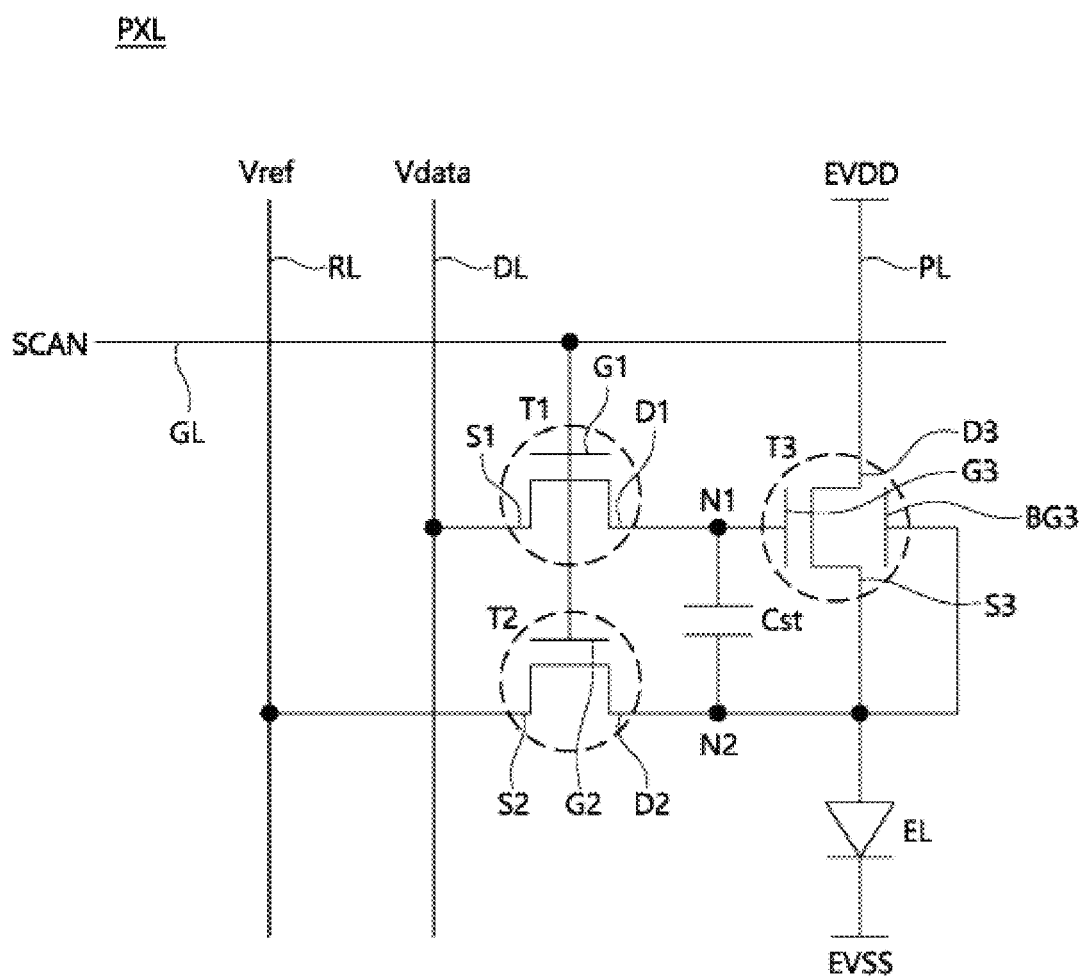
FIG. 2 is an example of an equivalent circuit diagram of a pixel included in a display panel of FIG. 1.

FIG. 1 is a block diagram illustrating an electroluminescent display apparatus according to an example embodiment of the present disclosure. FIG. 2 is an example of an equivalent circuit diagram of a pixel included in a display panel of FIG. 1.

Referring to FIGS. 1 and 2, the electroluminescent display apparatus according to an example embodiment of the present disclosure may include a display panel PNL, a timing controller TCON, a gate driver GDRV, and a data driver SDRV.

The display panel PNL may include a plurality of pixels PXL and a plurality of signal lines GL, DL, RL, and PL for transferring a driving signal to each of the pixels PXL. The signal lines GL, DL, RL, and PL may include a gate line GL which applies a scan pulse SCAN to a pixel PXL, a data line DL which applies a data voltage Vdata for image expression to the pixel PXL, a reference voltage line RL which applies a reference voltage Vref, which is for initializing a light emitting device EL, to the pixel PXL, and a power line PL which applies a pixel source voltage EVDD to the pixel PXL. The data voltage Vdata may be a voltage which may vary within a predetermined voltage range, based on a gray level of image data. On the other hand, the reference voltage Vref and the pixel source voltage EVDD may each be a voltage which is fixed at a predetermined level.

The number of reference voltage lines RL may be equal to the number of data lines DL. For example, a plurality of pixels PXL adjacent to one another in a horizontal direction (an extension direction of the gate line GL) may be connected to different reference voltage lines RL. Furthermore, the number of reference voltage lines RL may be less than the number of data lines DL. For example, the plurality of pixels PXL adjacent to one another in the horizontal direction (the extension direction of the gate line GL) may be connected to the same reference voltage line RL. In this case, in a 1 pixel row, a plurality of pixels PXL connected to the same reference voltage line RL may configure a unit pixel. A plurality of pixels PXL configuring a unit pixel may include red, green, and blue pixels PXL, and moreover, may further include a white pixel PXL.

The signal lines GL, DL, RL, and PL may define a pixel PXL. For example, each pixel PXL may be surrounded by the signal lines GL, DL, RL, and PL. Each pixel PXL may emit light having luminance corresponding to a level of the data voltage Vdata. A pixel circuit of FIG. 2 connected to the signal lines GL, DL, RL, and PL may be provided in each pixel PXL.

The pixel circuit may include a plurality of thin film transistors (TFTs), a storage capacitor Cst, and a light emitting device EL. The plurality of TFTs may include first to third TFTs T1 to T3.

The first TFT T1 may be turned on based on a scan pulse SCAN and may connect the data line DL to a third gate electrode G3 of the third TFT T3, and thus, the data voltage Vdata may be applied to the third gate electrode G3 of the third TFT T3. The first TFT T1 may be a switching transistor which includes a first gate electrode G1, a first source electrode S1, and a first drain electrode D1. The first gate electrode G1 of the first TFT T1 may be connected to the gate line GL, the first source electrode S1 of the first TFT T1 may be connected to the data line DL, and the first drain electrode D1 of the first TFT T1 may be connected to the third gate electrode G3 of the third TFT T3 and one electrode of the storage capacitor Cst through a first node N1.

The second TFT T2 may be turned on based on the scan pulse SCAN and may connect the reference voltage RL to a third source electrode S3 of the third TFT T3, and thus, the reference voltage Vref may be applied to a back gate electrode BG3 and the source electrode S3 of the third TFT T3 and an anode electrode of the light emitting device EL. The second TFT T2 may be a switching transistor which includes a second gate electrode G2, a second source electrode S2, and a second drain electrode D2. The second gate electrode G2 of the second TFT T2 may be connected to the gate line GL, the second source electrode S2 of the second TFT T2 may be connected to the reference voltage line RL, and the second drain electrode D2 of the second TFT T2 may be connected to the back gate electrode BG3 and the third source electrode S3 of the third TFT T3 and the other electrode of the storage capacitor Cst through a second node N2.

The third TFT T3 may be a driving transistor which generates a driving current proportional to a level of the data voltage Vdata and may include the third gate electrode G3, the third source electrode S3, a third drain electrode D3, and the back gate electrode BG3. The third gate electrode G3 of the third TFT T3 may be connected to the first node N1, the third rain electrode D3 of the third TFT T3 may be connected to the power line PL, and the third source electrode S3 of the third TFT T3 may be connected to the second node N2. The back gate electrode BG3 of the third TFT T3 may be connected to the second node N2 and may be supplied with the reference voltage Vref through the second TFT T2.

The one electrode of the storage capacitor Cst may be connected to the first node N1, and the other electrode of the storage capacitor Cst may be connected to the second node N2. The storage capacitor Cst may hold the data voltage Vdata, applied to the third gate electrode G3 of the third TFT T3, for a certain duration.

The light emitting device EL may be connected to the third source electrode S3 of the third TFT T3 and may emit light with a driving current supplied from the third TFT T3. The light emitting device EL may include the anode electrode connected to the second node N2, a cathode electrode connected to a low level source voltage EVSS, and at least one organic emission layer or at least one inorganic emission layer disposed between the anode electrode and the cathode electrode.

Each of the first to third TFTs T1 to T3 may include a semiconductor pattern including oxide. Oxide included in the semiconductor pattern may be one or more of indium gallium zinc oxide (IGZO), indium gallium oxide (IGO), and indium zinc oxide (IZO). An oxide semiconductor may have a characteristic where an off current is low, and thus, a voltage holding period of each pixel PXL may increase, whereby the oxide semiconductor may be suitable for a display apparatus requiring low speed driving or low power consumption.

Because the first to third TFTs T1 to T3 are formed on different planes (i.e., formed on different layers), a contact hole for a connection with each of the signal lines DL, RL, and PL may not be needed. The first source electrode S1 of the first TFT T1 may be directly connected to the data line DL without a contact hole, the second source electrode S2 of the second TFT T2 may be directly connected to the reference voltage line RL without a contact hole, and the third drain electrode D3 of the third TFT T3 may be directly connected to the power line PL without a contact hole.

Because the first to third TFTs T1 to T3 are formed on different planes, a separate jumping line and contact hole for forming the storage capacitor Cst may not be needed. Each of the first to third TFTs T1 to T3 formed on different planes may include a channel region and a conductive region. The storage capacitor Cst may be configured by an overlap between a conductive region of a first semiconductor pattern included in the first TFT T1 and a conductive region of a second semiconductor pattern included in the second TFT T2. In this case, the conductive region of the first semiconductor pattern may be one electrode of the storage capacitor Cst, and the conductive region of the second semiconductor pattern may be the other electrode of the storage capacitor Cst.

Because the first to third TFTs T1 to T3 are formed on different planes, the number of contact holes needed for each pixel PXL may decrease, and a separate jumping line for forming the storage capacitor Cst may be removed. As a result, in the present example embodiment, an aperture ratio of each pixel PXL may be enhanced, and a pixel per inch (PPI) may increase based on the same size, and thus, a high resolution may be easily implemented. In one or more aspects, an aperture ratio of a pixel PXL may be a ratio of a light-sensitive area of the pixel PXL to the total area of the pixel PXL.

Because the first to third TFTs T1 to T3 are formed on different planes, a portion of the conductive region of the second semiconductor pattern included in the second TFT T2 may be disposed to overlap a channel region included in the third TFT T3, and a portion of the conductive region of the second semiconductor pattern may be the back gate electrode BG3 of the third TFT T3. Accordingly, a driving characteristic of the third TFT T3 may be stabilized by the reference voltage Vref applied to the back gate electrode BG3, and thus, the reliability of a device may be enhanced.

The gate driver GDRV may drive the gate lines GL of the display panel PNL. The gate driver GDRV may generate the scan pulse SCAN and may sequentially supply the scan pulse SCAN to the gate lines GL. A pixel row to which the data voltage Vdata is to be supplied may be selected by the scan pulse SCAN.

The data driver SDRV may drive the data lines DL of the display panel PNL. The data driver SDRV may convert digital image data into analog data voltages Vdata and may supply the data voltages Vdata to the data lines DL. The data voltages Vdata supplied to the data lines DL may be supplied to a corresponding pixel row in synchronization with the scan pulse SCAN.

The timing controller TCON may correct digital image data by using a predetermined image quality compensation algorithm, and subsequently, may supply the corrected digital image data to the data driver SDRV. The timing controller TCON may control an operation timing of each of the gate driver GDRV and the data driver SDRV.

Figure 3:
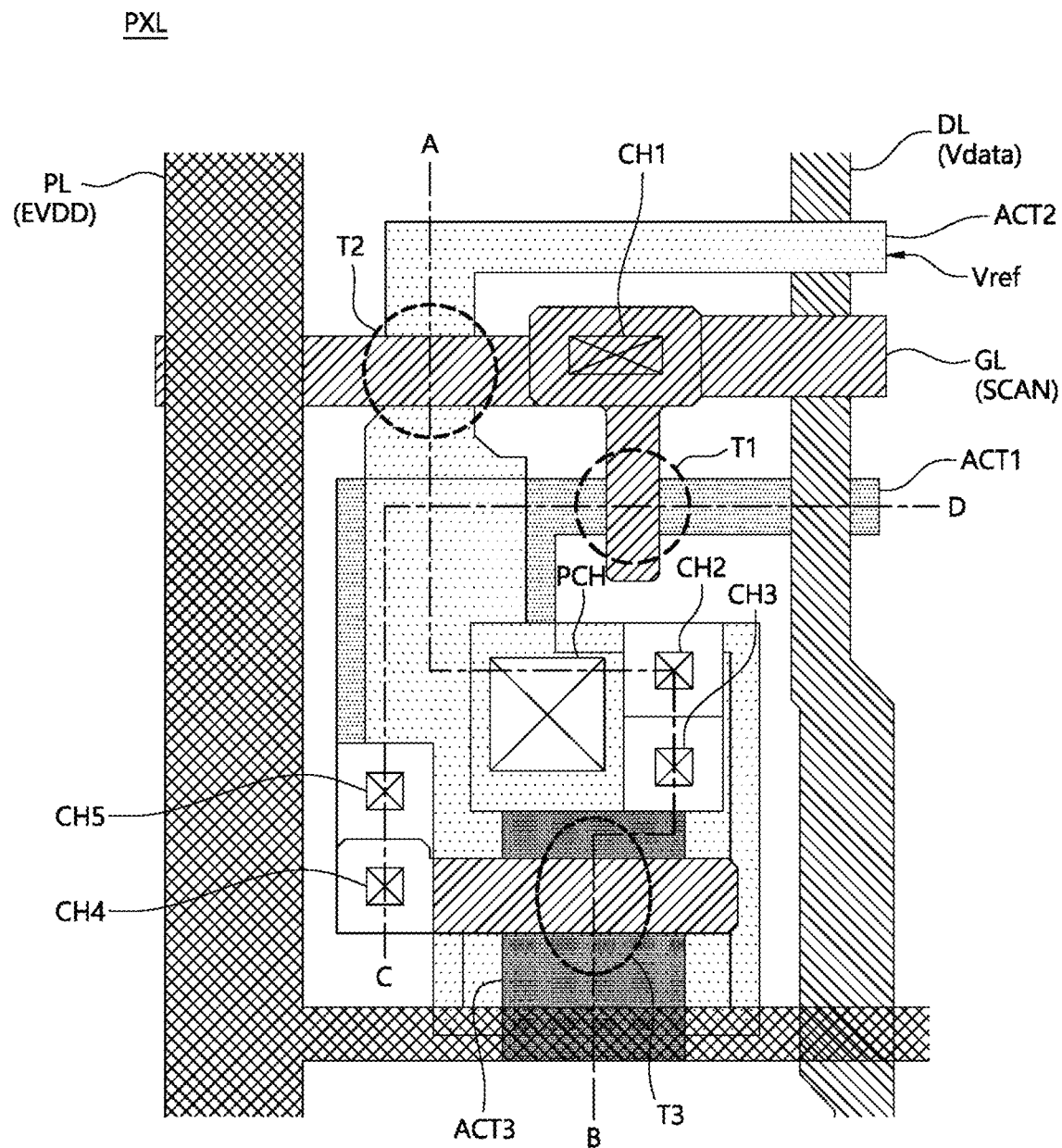
FIG. 3 is an example of a plan view illustrating a structure of a pixel included in the display panel of FIG. 1.
Figure 4:
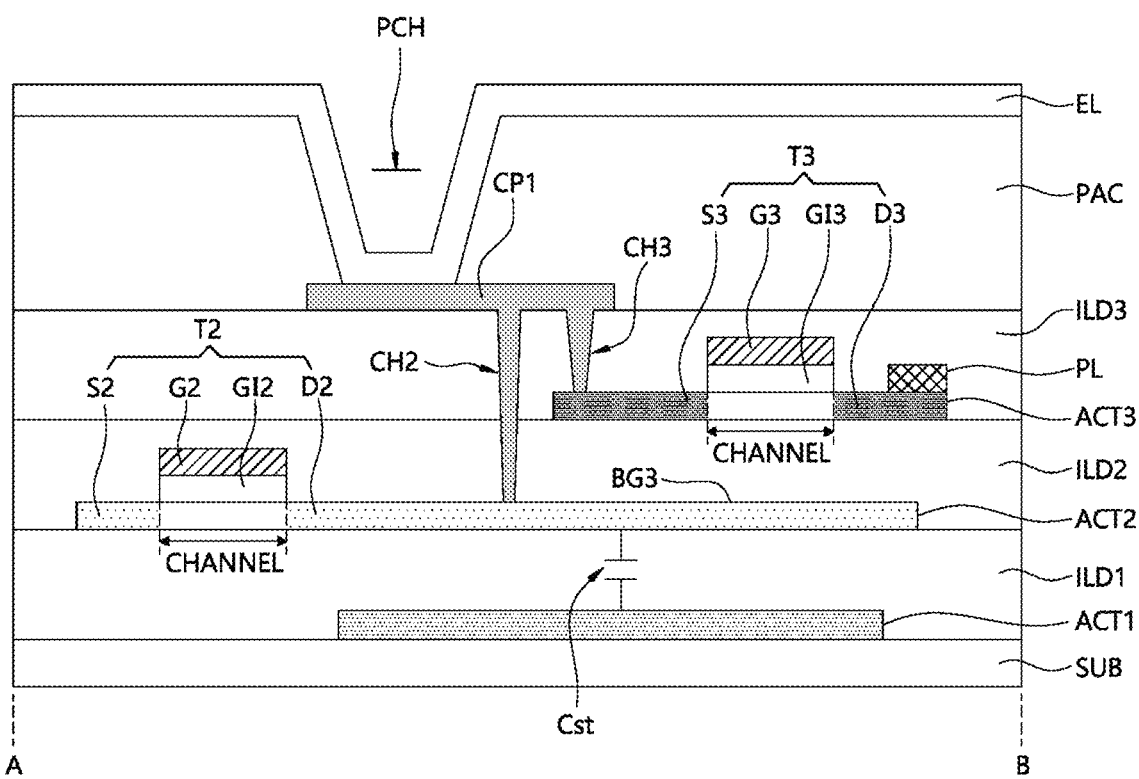
FIG. 4 is an example of a cross-sectional view of a pixel taken along line A-B of FIG. 3.
Figure 5:
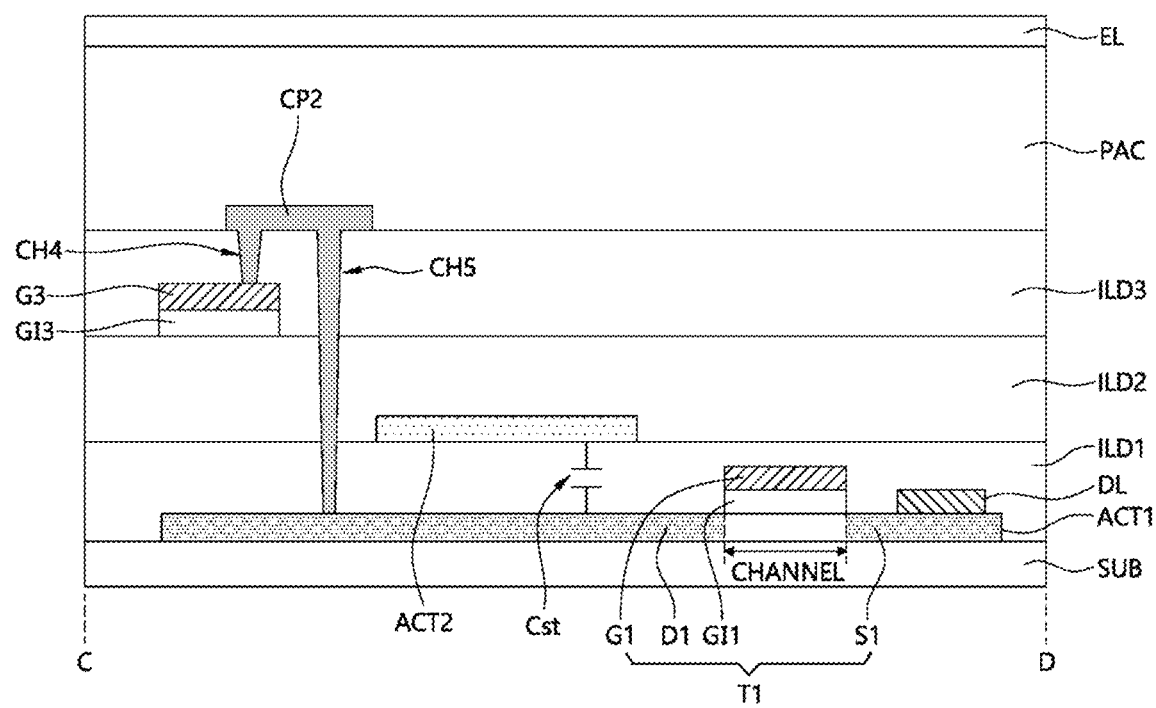
FIG. 5 is an example of another cross-sectional view of a pixel taken along line C-D of FIG. 3.
Figure 6A:
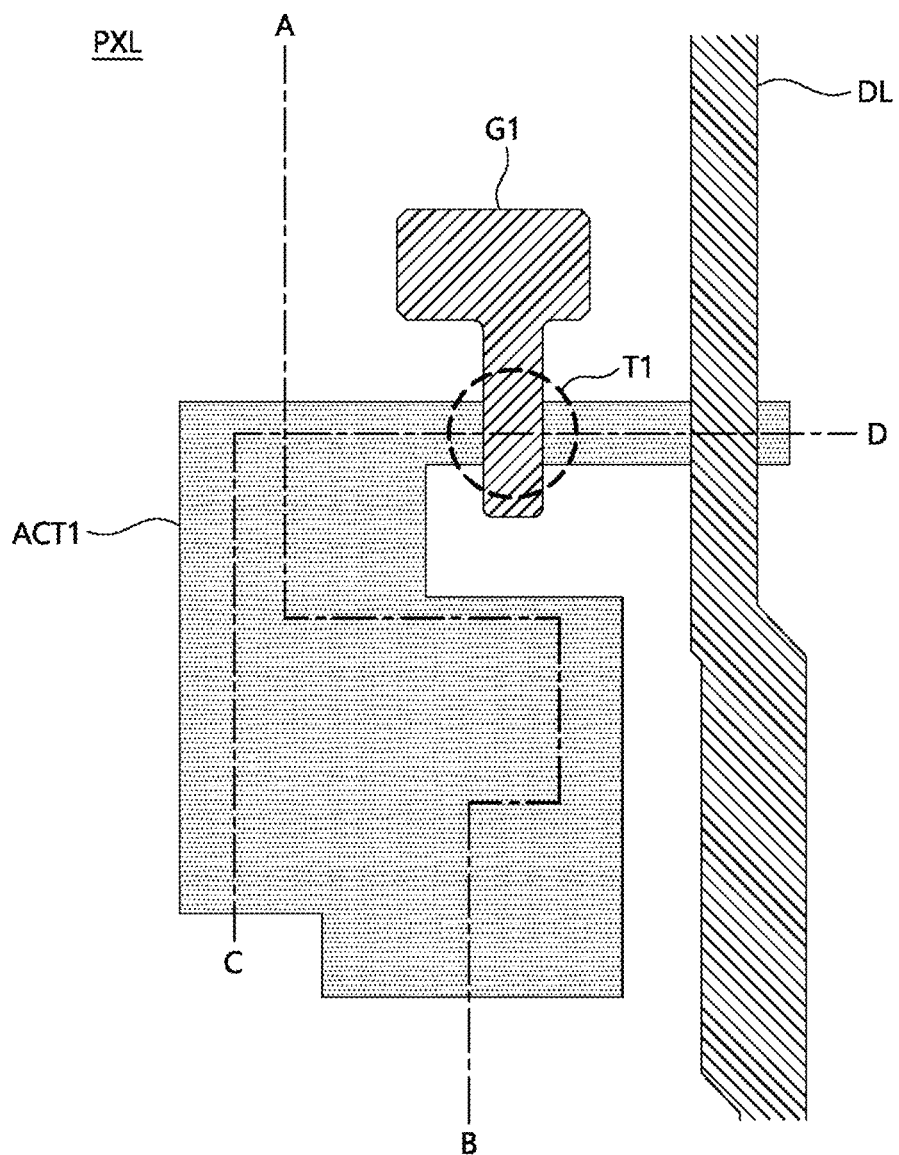
FIGS. 6A, 6B, and 6C are examples of diagrams illustrating a process of forming a first circuit pattern including a first semiconductor pattern, a first thin film transistor, and a data line on a substrate.
Figure 6B:
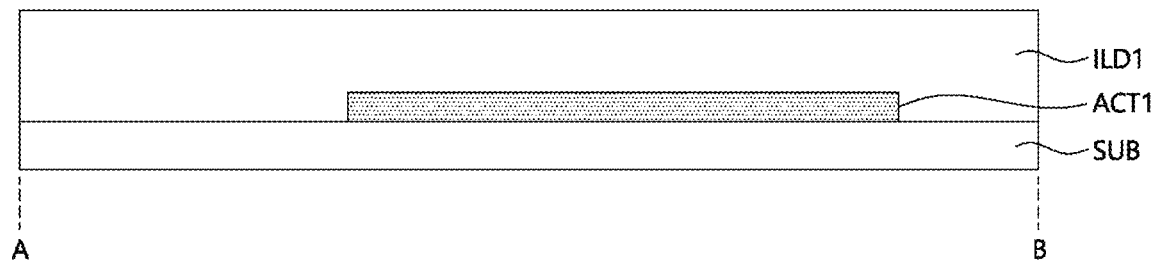
Figure 6C:
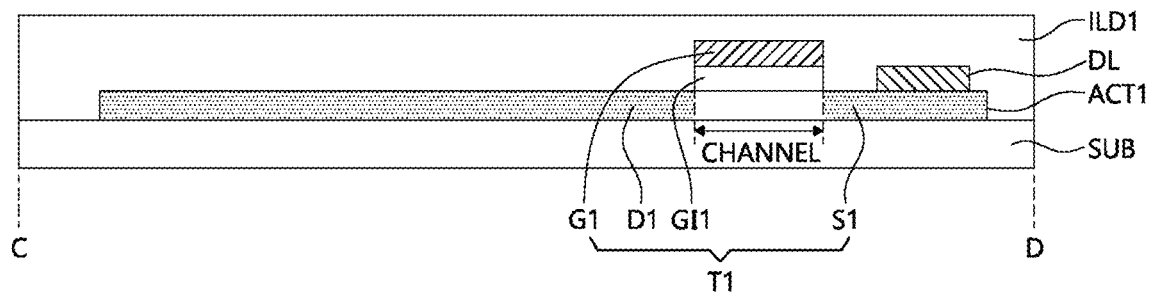
Figure 7A:
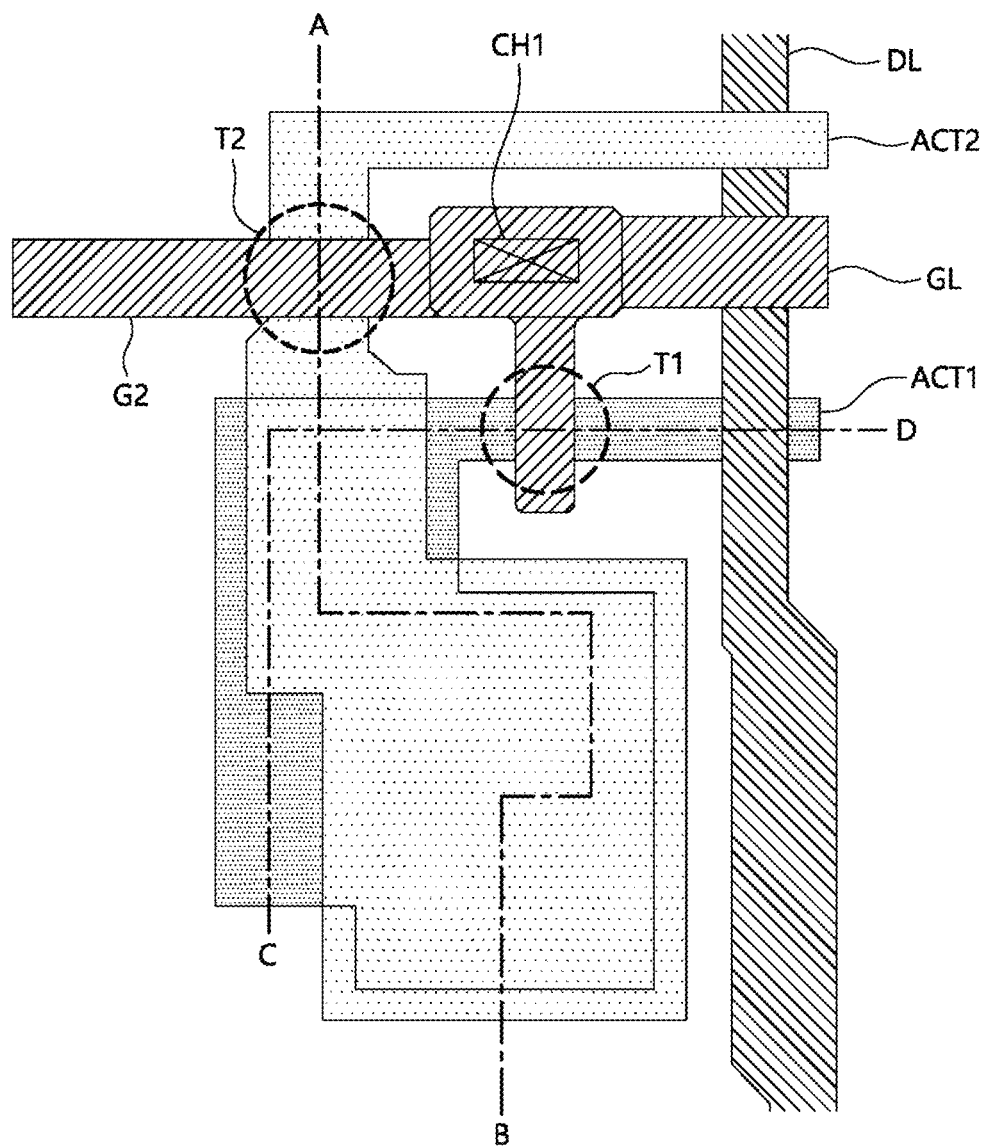
FIGS. 7A, 7B, and 7C are examples of diagrams illustrating a process of forming a second circuit pattern including a second semiconductor pattern, a second thin film transistor, a reference voltage line, and a gate line on a substrate with the first circuit pattern formed thereon.
Figure 7B:
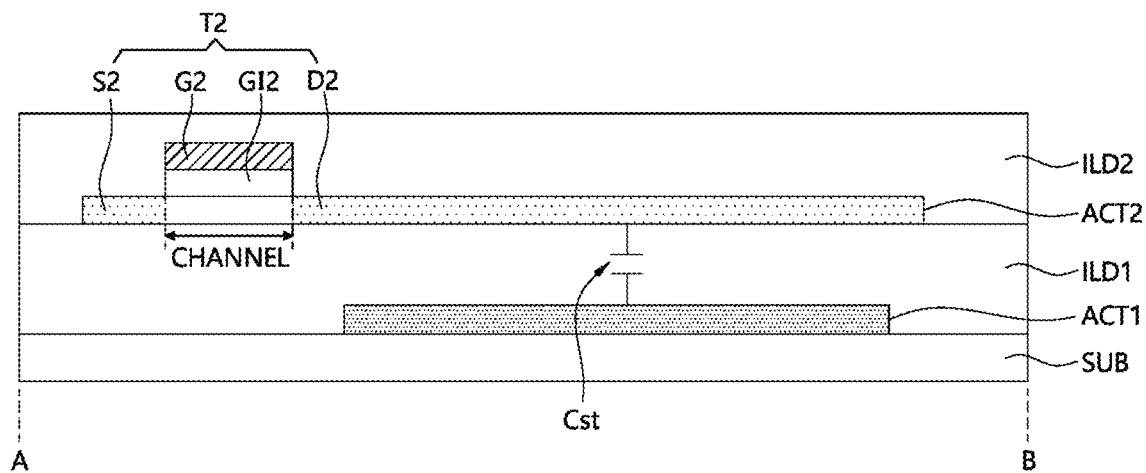
Figure 7C:
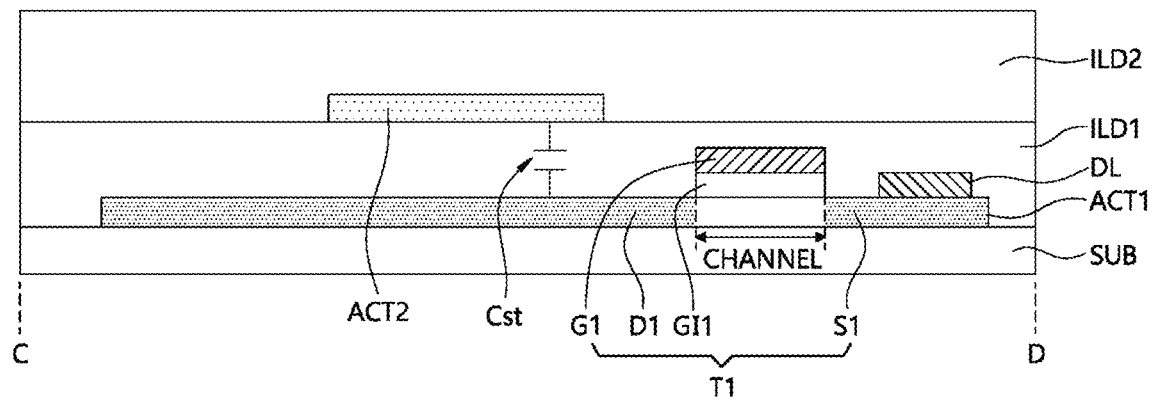
Figure 8A:
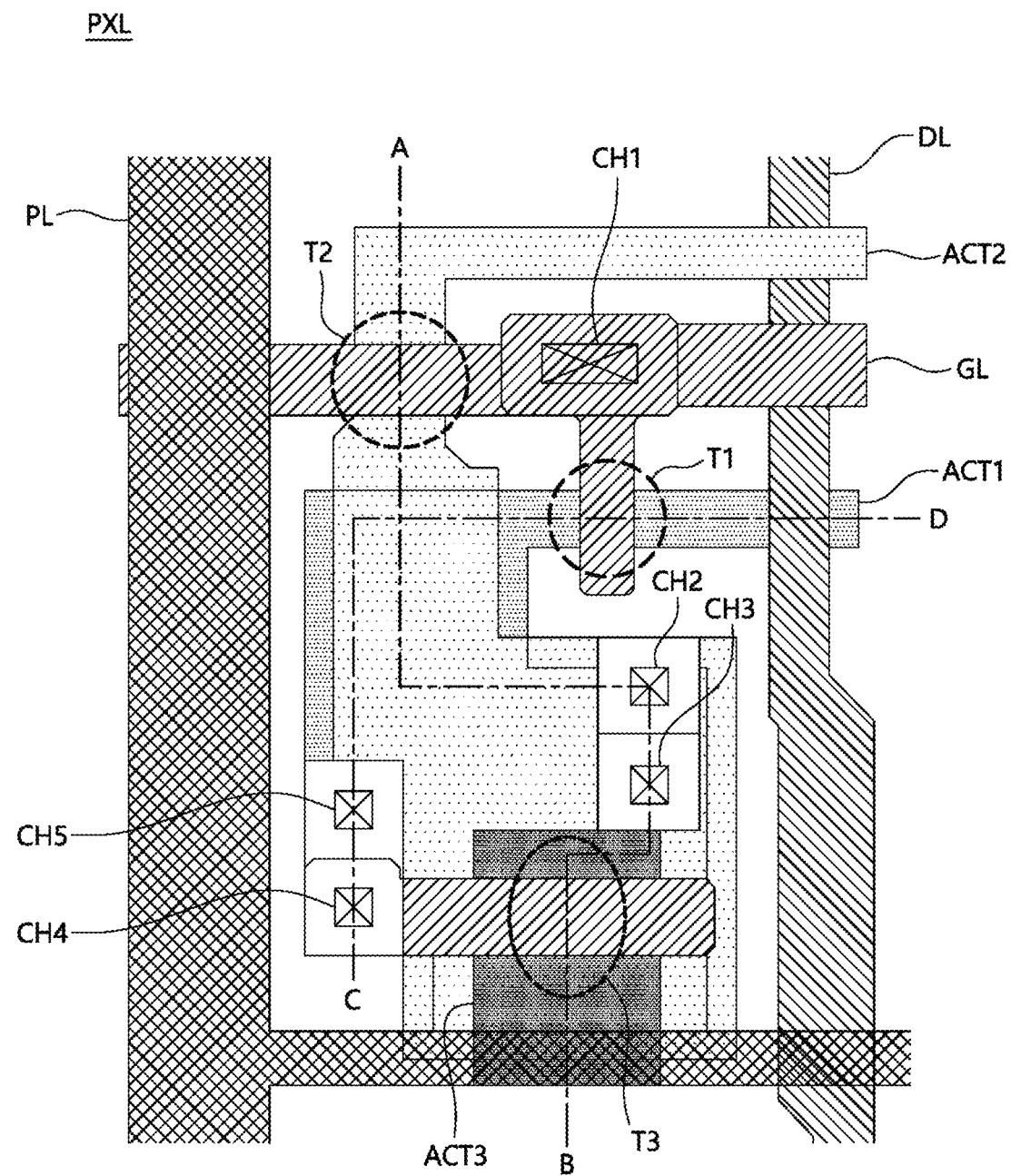
FIGS. 8A, 8B, and 8C are examples of diagrams illustrating a process of forming a third circuit pattern including a third semiconductor pattern, a third thin film transistor, and a power line on a substrate with the first circuit pattern and the second circuit pattern formed thereon.
Figure 8B:
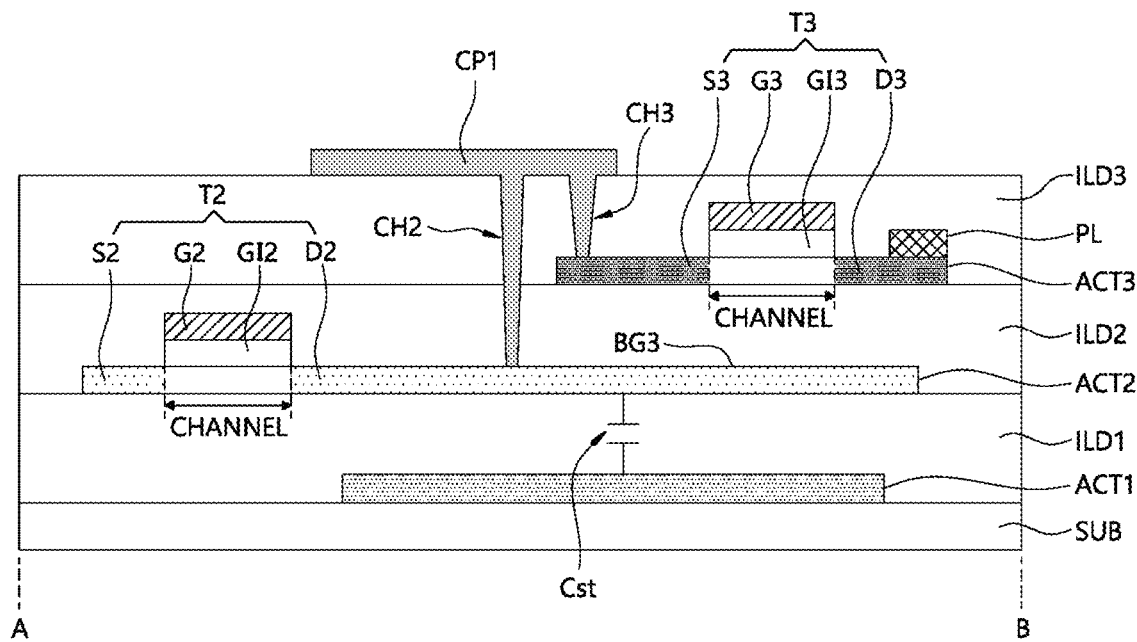
Figure 8C:
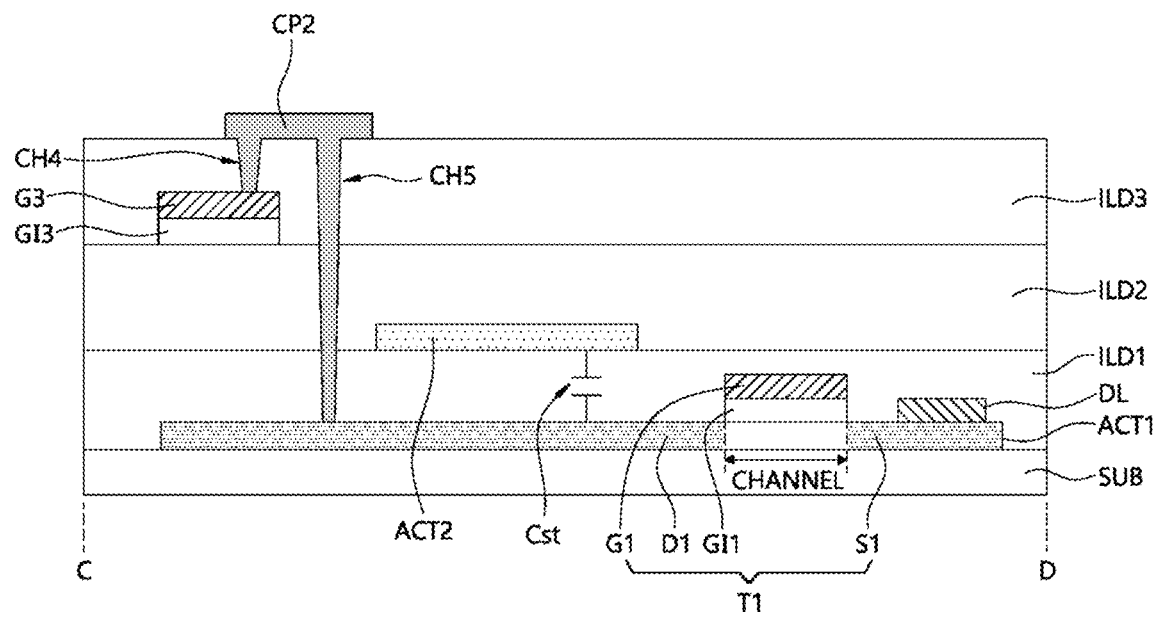

FIG. 3 is an example of a plan view illustrating a structure of a pixel included in the display panel of FIG. 1. FIG. 4 is an example of a cross-sectional view of a pixel taken along line A-B of FIG. 3. FIG. 5 is an example of another cross-sectional view of a pixel taken along line C-D of FIG. 3. FIGS. 6A, 6B, and 6C are examples of diagrams illustrating a process of forming a first circuit pattern including a first semiconductor pattern, a first thin film transistor, and a data line on a substrate. FIGS. 7A, 7B, and 7C are examples of diagrams illustrating a process of forming a second circuit pattern including a second semiconductor pattern, a second thin film transistor, a reference voltage line, and a gate line on a substrate with the first circuit pattern formed thereon. FIGS. 8A, 8B, and 8C are examples of diagrams illustrating a process of forming a third circuit pattern including a third semiconductor pattern, a third thin film transistor, and a power line on a substrate with the first circuit pattern and the second circuit pattern formed thereon.

Referring to FIGS. 3 to 6C, a first circuit pattern including a first semiconductor pattern ACT1, a first TFT T1, and a data line DL may be formed on a substrate SUB.

The first semiconductor pattern ACT1 may be patterned on the substrate SUB. The first semiconductor pattern ACT1 may have a bar shape which includes a first channel region which is not conductive and a first conductive region which is conductive. First conductive regions may be respectively disposed at both sides with the first channel region therebetween. A first conductive region disposed at one side of the first channel region may be a first source electrode S1 of a first TFT T1, and a first conductive region disposed at the other side of the first channel region may be a first drain electrode D1 of the first TFT T1.

A conductive metal material may be deposited on the first semiconductor pattern ACT1, and subsequently, the data line DL may be patterned using a patterning process. The data line DL may be directly connected to the first source electrode S1 of the first TFT T1 without a contact hole, and thus, may contribute to increase an aperture ratio of a pixel PXL and an PPI of a display panel PNL.

A gate insulation material and a conductive metal material may be sequentially deposited on the other region, except a region where the data line DL is formed, of the first semiconductor pattern ACT1, and subsequently, a first gate insulation layer GI1 and a first gate electrode G1 may be patterned using a patterning process. The first gate electrode G1 may overlap a first channel region of the first semiconductor pattern ACT1 with the first gate insulation layer GI1 therebetween. The first gate insulation layer GI1 and the first gate electrode G1 may be included in the first TFT T1.

The first gate electrode G1 may be patterned using a wet etching process, and subsequently, a dry etching process may be performed on the first gate insulation layer GI1 by using the first gate electrode G1 as a mask. In performing the dry etching process on the first gate insulation layer GI1, an oxide bond of the first semiconductor pattern ACT1 may be released in the other region except the first channel region, and thus, the other region of the first semiconductor pattern ACT1 may be conductive. Furthermore, the channel region of the first semiconductor pattern ACT1 may be covered by the first gate insulation layer GI1 and the first gate electrode G1, and thus, may not be conductive.

A first interlayer insulation layer ILD1 including an inorganic insulation material may be disposed on the substrate SUB where the first circuit pattern described above is formed. The first interlayer insulation layer ILD1 may cover the first semiconductor pattern ACT1, the data line DL, and the first gate electrode G1.

Referring to FIGS. 3 to 5 and 7A to 7C, a second circuit pattern including a second semiconductor pattern ACT2, a second TFT T2, a reference voltage line RL, and a gate line GL may be formed on the substrate SUB where the first interlayer insulation layer ILD1 is formed.

The second semiconductor pattern ACT2 may be patterned on the first interlayer insulation layer ILD1. The second semiconductor pattern ACT2 may have a bar shape which includes a second channel region which is not conductive and a second conductive region which is conductive. Second conductive regions may be respectively disposed at both sides with the second channel region therebetween. A second conductive region disposed at one side of the second channel region may be a second source electrode S2 of a second TFT T2, and a second conductive region disposed at the other side of the second channel region may be a second drain electrode D2 of the second TFT T2.

Furthermore, a portion of the second conductive region extending from the second drain electrode D2 of the second TFT T2 may overlap a third channel region of a third TFT T3 and may be a back gate electrode BG3 of the third TFT T3. A portion of the second conductive region may function as the back gate electrode BG3 of the third TFT T3, and thus, a separate jumping line and contact hole for forming the back gate electrode BG3 may not be needed and an aperture ratio of a pixel PXL and an PPI of a display panel PNL may increase.

Although not shown, a conductive metal material may be deposited on the second semiconductor pattern ACT2, and subsequently, the reference voltage line RL may be patterned using a patterning process. The reference voltage line RL may be directly connected to the second source electrode S2 of the second TFT T2 without a contact hole, and thus, may contribute to increase an aperture ratio of a pixel PXL and an PPI of the display panel PNL.

A gate insulation material and a conductive metal material may be sequentially deposited on the other region, except a region where the reference voltage line RL is formed, of the second semiconductor pattern ACT2, and subsequently, a second gate insulation layer GI2, a second gate electrode G2, and a gate line GL extending from the second gate electrode G2 may be patterned using a patterning process. The second gate electrode G2 may overlap a second channel region of the second semiconductor pattern ACT2 with the second gate insulation layer GI2 therebetween. The second gate insulation layer GI2 and the second gate electrode G2 may be included in the second TFT T2. The gate line GL may extend from the second gate electrode G2, on the second gate insulation layer GI2.

The second gate electrode G2 may be patterned using a wet etching process, and subsequently, a dry etching process may be performed on the second gate insulation layer GI2 by using the second gate electrode G2 and the gate line GL as a mask. In performing the dry etching process on the second gate insulation layer GI2, an oxide bond of the second semiconductor pattern ACT2 may be released in the other region except the second channel region, and thus, the other region of the second semiconductor pattern ACT2 may be conductive. Furthermore, the channel region of the second semiconductor pattern ACT2 may be covered by the second gate insulation layer GI2 and the second gate electrode G2, and thus, may not be conductive.

The gate line GL may be connected to the first gate electrode G1 of the first TFT T1 through a first contact hole CH1 passing through the second gate insulation layer GI2 and the first interlayer insulation layer ILD1. Therefore, the first gate electrode G1 of the first TFT T1 and the second gate electrode G2 of the second TFT T2 may be connected to the same gate line GL and may be simultaneously turned on/off by the same scan pulse SCAN, and thus, an aperture ratio of a pixel PXL may increase and a PPI of the display panel PXL may increase.

Unlike the illustration of the drawing, the first gate electrode G1 of the first TFT T1 and the second gate electrode G2 of the second TFT T2 may be connected to different gate lines. In this case, in addition to the gate line GL extending from the second gate electrode G2 on the second gate insulation layer GI2, an additional gate line (not shown) extending from the first gate line G1 may be further formed on the first gate insulation layer GI1. In a pixel structure where the first gate electrode G1 of the first TFT T1 and the second gate electrode G2 of the second TFT T2 are connected to different gate lines, the first contact hole CH1 may be omitted.

Furthermore, a first conductive region of the first semiconductor pattern ACT1 and a second conductive region of the second semiconductor pattern ACT2 may partially overlap each other with the first interlayer insulation layer ILD1 therebetween, and thus, may configure a storage capacitor Cst, thereby contributing to increasing an aperture ratio of the pixel PXL and an PPI of the display panel PNL.

The storage capacitor Cst may be connected to the first conductive region of the first semiconductor pattern ACT1 and the second conductive region of the second semiconductor pattern ACT2. A first electrode of the storage capacitor Cst may be the first conductive region of the first semiconductor pattern ACT1 which partially overlaps the second conductive region of the second semiconductor pattern ACT2 with the first interlayer insulation layer ILD1 therebetween. Further, a second electrode of the storage capacitor Cst may be the second conductive region of the second semiconductor pattern ACT2 which partially overlaps the first conductive region of the first semiconductor pattern ACT1 with the first interlayer insulation layer ILD1 therebetween.

A second interlayer insulation layer ILD2 including an inorganic insulation material may be disposed on the substrate SUB where the second circuit pattern described above is formed. The second interlayer insulation layer ILD2 may cover the second semiconductor pattern ACT2, the gate line GL, the second gate electrode G2, and the first interlayer insulation layer ILD1 exposed by the second circuit pattern.

Referring to FIGS. 3 to 5 and 8A to 8C, a third circuit pattern including a third semiconductor pattern ACT3, a third TFT T3, and a power line PL may be formed on the substrate SUB where the second interlayer insulation layer ILD2 is formed.

The third semiconductor pattern ACT3 may be patterned on the second interlayer insulation layer ILD2. The third semiconductor pattern ACT3 may have a bar shape which includes a third channel region which is not conductive and a third conductive region which is conductive. Third conductive regions may be respectively disposed at both sides with the third channel region therebetween. A third conductive region disposed at one side of the third channel region may be a third source electrode S3 of a third TFT T3, and a third conductive region disposed at the other side of the third channel region may be a third drain electrode D3 of the third TFT T3.

A conductive metal material may be deposited on the third semiconductor pattern ACT3, and subsequently, the power line PL may be patterned using a patterning process. The power line PL may be directly connected to the third drain electrode D3 of the third TFT T3 without a contact hole, and thus, may contribute to increasing an aperture ratio of the pixel PXL and an PPI of the display panel PNL.

A gate insulation material and a conductive metal material may be sequentially deposited on the other region, except a region where the power line PL is formed, of the third semiconductor pattern ACT3, and subsequently, a third gate insulation layer GI3 and a third gate electrode G3 may be patterned using a patterning process. The third gate electrode G3 may overlap a third channel region of the third semiconductor pattern ACT3 with the third gate insulation layer GI3 therebetween. The third gate insulation layer GI3 and the third gate electrode G3 may be included in the third TFT T3.

The third gate electrode G3 may be patterned using a wet etching process, and subsequently, a dry etching process may be performed on the third gate insulation layer GI3 by using the third gate electrode G3 as a mask. In performing the dry etching process on the third gate insulation layer GI3, an oxide bond of the third semiconductor pattern ACT3 may be released in the other region except the third channel region, and thus, the other region of the third semiconductor pattern ACT3 may be conductive. Furthermore, the channel region of the third semiconductor pattern ACT3 may be covered by the third gate insulation layer GI3 and the third gate electrode G3, and thus, may not be conductive.

A third interlayer insulation layer ILD3 including an inorganic insulation material may be disposed on the substrate SUB where the third circuit pattern described above is formed. The third interlayer insulation layer ILD3 may cover the third semiconductor pattern ACT3, the power line PL, the third gate electrode G3, and the second interlayer insulation layer ILD2 exposed by the third circuit pattern.

A first conductive connection pattern CP1 may be disposed on the third interlayer insulation layer ILD3. The first conductive connection pattern CP1 may be the second node N2 of FIG. 2. The first conductive connection pattern CP1 may be connected to a conductive region of the second semiconductor pattern ACT2 through a second contact hole CH2 passing through the second interlayer insulation layer ILD2 and the third interlayer insulation layer ILD3. Further, the first conductive connection pattern CP1 may be connected to a conductive region of the third semiconductor pattern ACT3 through a third contact hole CH3 passing through the third interlayer insulation layer ILD3.

A second conductive connection pattern CP2 may be further disposed on the third interlayer insulation layer ILD3. The second conductive connection pattern CP2 may be the first node N1 of FIG. 2. The second conductive connection pattern CP2 may be connected to a third gate electrode G3 of the third TFT T3 through a fourth contact hole CH4 passing through the third interlayer insulation layer ILD3. Further, the second conductive connection pattern CP2 may be connected to a conductive region of the first semiconductor pattern ACT1 through a fifth contact hole CH5 passing through the first to third interlayer insulation layers ILD1 to ILD3.

An organic insulation layer PAC may be disposed on the first and second conductive connection patterns CP1 and CP2. The organic insulation layer PAC may include an organic insulation layer, and thus, a step caused by a stack structure of the first to third TFTs T1 to T3 may be removed. The organic insulation layer PAC may cover the first and second conductive connection patterns CP1 and CP2 and the third interlayer insulation layer ILD3 exposed by the first and second conductive connection patterns CP1 and CP2.

A light emitting device EL may be disposed on the organic insulation layer PAC. The light emitting device EL may be connected to the first conductive connection pattern CP1 exposed through a pixel contact hole PCH passing through the organic insulation layer PAC.

The light emitting device EL may include a first electrode, an emission layer, and a second electrode which are sequentially stacked. The first electrode may have a multi-layer structure including metal which is relatively high in reflectance. The first electrode may be electrically connected to the third source electrode S3 of the third TFT T3 through the pixel contact hole PCH and may be supplied with a driving current from the third TFT T3. The emission layer may include a light emitting material and may emit light corresponding a level of the driving current. The light emitting material may include an organic material, an inorganic material, or a hybrid material. The emission layer may have a multi-layer structure so as to increase emission efficiency. The second electrode may be a transparent electrode which includes a material (for example, a transparent conductive material such as ITO and IZO) which differs from that of the first electrode. A low level source voltage EVSS may be applied to the second electrode, and light emitted from the emission layer may be discharged to the outside through the second electrode.

The light emitting device EL may operate independently for each pixel PXL. In order to prevent the occurrence of light interference between adjacent pixels PXL, a bank insulation layer for defining an emission area of each pixel PXL may be further disposed on the organic insulation layer PAC. The bank insulation layer may be disposed in a non-emission area and may define the emission area of each pixel PXL. The first electrode and the emission layer of the light emitting device EL may be patterned to be disposed in the emission area, and the second electrode thereof may be disposed in the non-emission area as well as the emission area of each pixel PXL.

An encapsulation layer may be further disposed on the light emitting device EL. The encapsulation layer may prevent the light emitting device EL from being damaged by an external impact and water. The encapsulation layer may be implemented as a multilayer which includes one or more organic insulation layers and one or more inorganic insulation layers.

As described above, because the first to third TFTs T1 to T3 according to the present example embodiment are disposed on different planes, a conductive region of the first semiconductor pattern ACT1, a conductive region of the second semiconductor pattern ACT2, and a conductive region of the third semiconductor pattern ACT3 may partially overlap one another with one or more interlayer insulation layers therebetween. The storage capacitor Cst may be easily formed, and an aperture ratio may increase based on the conductive region of the first semiconductor pattern ACT1 and the conductive region of the second semiconductor pattern ACT2. The back gate electrode BG3 of the third TFT T3 may be easily formed, and an aperture ratio may increase based on the conductive region of the second semiconductor pattern ACT2 and the conductive region of the third semiconductor pattern ACT3.

Because the conductive region of the first semiconductor pattern ACT1 has a structure exposed by the first gate insulation layer GI1 and the first gate electrode G1 of the first TFT T1, a process performed on conductive properties of the first semiconductor pattern ACT1 may be easy. Because the conductive region of the second semiconductor pattern ACT2 has a structure exposed by the second gate insulation layer GI2 and the second gate electrode G2 of the second TFT T2, a process performed on conductive properties of the second semiconductor pattern ACT2 may be easy. Further, because the conductive region of the third semiconductor pattern ACT3 has a structure exposed by the third gate insulation layer GI3 and the third gate electrode G3 of the third TFT T3, a process performed on conductive properties of the third semiconductor pattern ACT3 may be easy.

Figure 9:
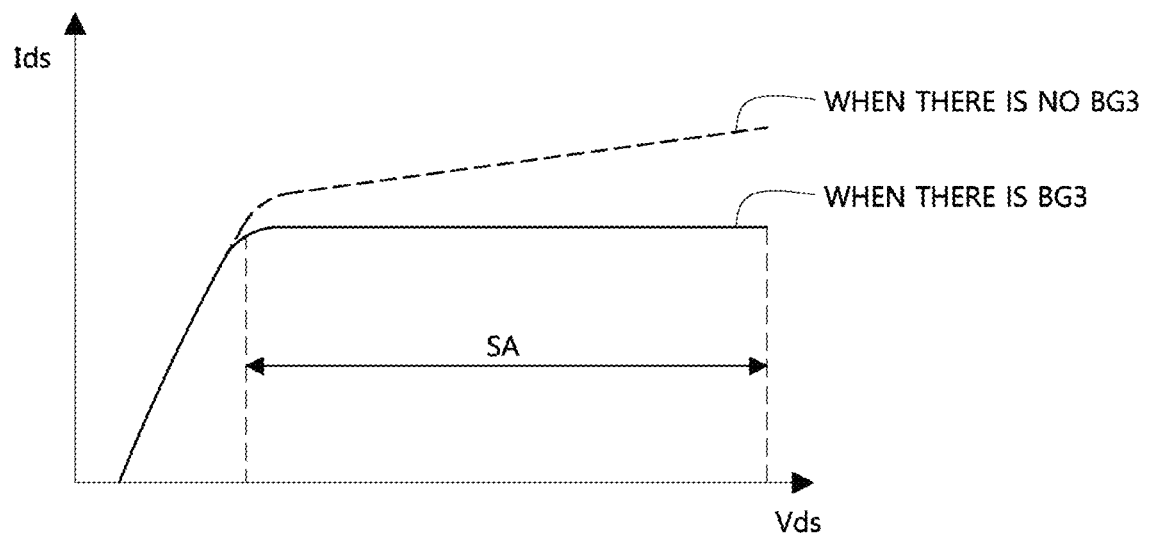
FIG. 9 is an example of a diagram illustrating a technical effect when a portion of a conductive region of a second semiconductor pattern overlaps a third channel region of a third thin film transistor.

FIG. 9 is an example of a diagram illustrating a technical effect when a portion of a conductive region of a second semiconductor pattern overlaps a third channel region of a third thin film transistor.

As described above, in the present example embodiment, a portion of a conductive region of a second semiconductor pattern disposed under a third TFT may be used as a back gate electrode BG3 of the third TFT. A fixed voltage (i.e., a reference voltage) may be supplied to the back gate electrode BG3 of the third TFT through a second TFT, and thus, an operation characteristic of the third TFT may be stabilized.

Because the third TFT is a driving transistor, as illustrated in FIG. 9, an operation characteristic for gray level expression may be stabilized only when the driving transistor operates in a saturation area SA of a characteristic curve representing a drain-source current Ids with respect to a drain-source voltage Vds. This is because a driving current (i.e., Ids) flowing in the driving transistor should be controlled by a gate-source voltage, instead of the drain-source voltage Vds. Here, the gate-source voltage may be a difference voltage between a data voltage applied to a gate electrode of the driving transistor and a reference voltage applied a source electrode of the driving transistor.

When there is no back gate electrode BG3 of the third TFT, there may be a problem where a driving current of the third TFT increases continuously in proportion to the drain-source voltage Vds, based on a back channel current which is mainly generated in an oxide semiconductor.

In the present example embodiment, as the reference voltage is applied to the back gate electrode BG3 of the third TFT, a back channel current of the third TFT may be prevented. As a result, an Ids-Vds characteristic curve where the third TFT operates may be saturated, and a driving characteristic of the third TFT may be stabilized, thereby securing device reliability.

According to the present example embodiment, because a plurality of TFTs included in the same pixel are disposed on different planes (or layers), a contact hole for connecting a TFT to a signal line may not be needed, and a separate jumping line and contact hole for forming a storage capacitor may not be needed.

According to the present example embodiment, the number of contact holes needed for each pixel may decrease, and a separate jumping line for forming a storage capacitor may be removed. Accordingly, in the present example embodiment, an aperture ratio of a pixel may be enhanced, and a PPI may increase based on the same size, and thus, a high resolution may be easily implemented.

According to the present example embodiment, a portion of a semiconductor pattern (i.e., a portion of a conductive region) of a switching transistor disposed under a driving transistor may operate as a back gate electrode of the driving transistor. Because a fixed voltage is applied to the back gate electrode of the driving transistor through a switching transistor, an operation characteristic of the driving transistor may be stabilized, and device reliability may be enhanced.

The effects according to the present disclosure are not limited to the above examples, and other various effects may be within the scope of the present disclosure.

While the present disclosure has been particularly shown and described with reference to exemplary embodiments thereof, it will be understood by those of ordinary skill in the art that various modifications and variations in form and details may be made without departing from the spirit and scope of the present disclosure. Thus, it is intended that the present disclosure covers the modifications and variations of this disclosure provided they come within the scope of the appended claims and their equivalents.

What is claimed is:

1. An electroluminescent display apparatus comprising:
   a first semiconductor pattern disposed on a substrate, the first semiconductor pattern including a first channel region and a first conductive region which is a region other than the first channel region;
   a first gate electrode overlapping the first channel region of the first semiconductor pattern with a first gate insulation layer therebetween;

a data line directly connected to the first conductive region of the first semiconductor pattern without a contact hole;

a first interlayer insulation layer covering the first semiconductor pattern and the first gate electrode;

a second semiconductor pattern disposed on the first interlayer insulation layer, the second semiconductor pattern including a second channel region and a second conductive region which is a region other than the second channel region; and a second gate electrode overlapping the second channel region of the second semiconductor pattern with a second gate insulation layer therebetween, wherein the first conductive region of the first semiconductor pattern partially overlaps the second conductive region of the second semiconductor pattern with the first interlayer insulation layer therebetween.

2. The electroluminescent display apparatus of claim 1, further comprising a storage capacitor connected to the first conductive region of the first semiconductor pattern and the second conductive region of the second semiconductor pattern.

3. The electroluminescent display apparatus of claim 2, wherein a first electrode of the storage capacitor is a portion of the first conductive region of the first semiconductor pattern partially overlapping the second conductive region of the second semiconductor pattern with the first interlayer insulation layer therebetween, and a second electrode of the storage capacitor is a portion of the second conductive region of the second semiconductor pattern partially overlapping the first conductive region of the first semiconductor pattern with the first interlayer insulation layer therebetween.

4. The electroluminescent display apparatus of claim 1, further comprising a reference voltage line directly connected to the second conductive region of the second semiconductor pattern without a contact hole.

5. The electroluminescent display apparatus of claim 1, further comprising:

a second interlayer insulation layer covering the second semiconductor pattern, the second gate electrode, and the first interlayer insulation layer;

a third semiconductor pattern disposed on the second interlay insulation layer, the third semiconductor pattern including a third channel region and a third conductive region which is a region other than the third channel region; and a third gate electrode overlapping the third channel region of the third semiconductor pattern with a third gate insulation layer therebetween.

6. The electroluminescent display apparatus of claim 5, further comprising a power line directly connected to the third conductive region of the third semiconductor pattern.

7. The electroluminescent display apparatus of claim 5, wherein a portion of the second conductive region of the second semiconductor pattern overlaps the third channel region of the third semiconductor pattern.

8. The electroluminescent display apparatus of claim 7, wherein the electroluminescent display apparatus is configured to apply a fixed voltage having a certain level to the second conductive region of the second semiconductor pattern.

9. The electroluminescent display apparatus of claim 1, further comprising a gate line extending from the second gate electrode on the second gate insulation layer, wherein the gate line is connected to the first gate electrode through a first contact hole passing through the second gate insulation layer and the first interlayer insulation layer.

10. The electroluminescent display apparatus of claim 1, further comprising:

a first gate line extending from the first gate electrode on the first gate insulation layer; and a second gate line extending from the second gate electrode on the second gate insulation layer.

11. The electroluminescent display apparatus of claim 6, further comprising:

a third interlayer insulation layer covering the third semiconductor pattern, the third gate electrode, the power line, and the second interlayer insulation layer; and a first conductive connection pattern disposed on the third interlayer insulation layer, wherein the first conductive connection pattern is connected to the second conductive region of the second semiconductor pattern through a second contact hole passing through the second interlayer insulation layer and the third interlayer insulation layer and is connected to the third conductive region of the third semiconductor pattern through a third contact hole passing through the third interlayer insulation layer.

12. The electroluminescent display apparatus of claim 11, further comprising:

an organic insulation layer covering the first conductive connection pattern and the third interlayer insulation layer; and a light emitting device connected to the first conductive connection pattern through a pixel contact hole passing through the organic insulation layer.

13. The electroluminescent display apparatus of claim 6, further comprising:

a third interlayer insulation layer covering the third semiconductor pattern, the third gate electrode, the power line, and the second interlayer insulation layer; and a second conductive connection pattern disposed on the third interlayer insulation layer, wherein the second conductive connection pattern is connected to the third gate electrode through a fourth contact hole passing through the third interlayer insulation layer and is connected to the first conductive region of the first semiconductor pattern through a fifth contact hole passing through the first interlayer insulation layer, the second interlayer insulation layer, and the third interlayer insulation layer.

14. The electroluminescent display apparatus of claim 5, wherein the first conductive region of the first semiconductor pattern, the second conductive region of the second semiconductor pattern, and the third conductive region of the third semiconductor pattern overlap one another partially.

15. The electroluminescent display apparatus of claim 5, wherein the first conductive region of the first semiconductor pattern is exposed by the first gate electrode and the first gate insulation layer, the second conductive region of the second semiconductor pattern is exposed by the second gate electrode and the second gate insulation layer, and the third conductive region of the third semiconductor pattern is exposed by the third gate electrode and the third gate insulation layer.

16. The electroluminescent display apparatus of claim 1, further comprising a reference voltage line directly connected to the second conductive region of the second semiconductor pattern.

17. The electroluminescent display apparatus of claim 16, further comprising a power line directly connected to the third conductive region of the third semiconductor pattern.

18. The electroluminescent display apparatus of claim 16, wherein the first interlayer insulation layer covers the data line.

* * * * *